(12) United States Patent
Chen et al.

(10) Patent No.: US 6,656,573 B2
(45) Date of Patent: Dec. 2, 2003

(54) METHOD TO GROW SELF-ASSEMBLED EPITAXIAL NANOWIRES

(75) Inventors: Yong Chen, Redwood City, CA (US); R. Stanley Williams, Redwood City, CA (US); Douglas A. A. Ohlberg, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 44 days.

(21) Appl. No.: 10/008,058

(22) Filed: Nov. 13, 2001

(65) Prior Publication Data

US 2003/0008505 A1 Jan. 9, 2003

Related U.S. Application Data

(60) Provisional application No. 60/300,440, filed on Jun. 26, 2001.

(51) Int. Cl.$^7$ .......................... C30B 29/10; C30B 23/00
(52) U.S. Cl. .................. 428/195; 428/212; 428/221; 428/446; 117/84; 117/105; 117/106; 117/108; 117/939
(58) Field of Search ................... 428/195, 209, 428/446, 221, 292.1, 212; 117/939, 84, 105, 106, 108

(56) References Cited

U.S. PATENT DOCUMENTS 5,045,408 A 9/1991 Williams et al.

6,187,165 B1 * 2/2001 Chien et al. .................. 205/118
6,231,744 B1 * 5/2001 Ying et al. .................... 205/324

OTHER PUBLICATIONS

Yong Chen et al., "Nanowires of Four Epitaxial Hexagonal Silicides Grown on Si(001)", Journal of Applied Physics, vol. 91, No. 5, pp. 3213–3218 (Mar. 1, 2002).
K.L. Kavanagh et al., "High–temperature epitaxy of PtSi/Si(001)", Journal of Crystal Growth, vol. 173, pp. 393–401 (1997) No month.
P.M. Petroff et al., "MBE and MOCVD Growth and Properties of Self–Assembling Quantum Dot Arrays in III–V Semiconductor Structures", Superlattices and Microstructures, vol. 15, pp. 15–21 (1994) No month.
Yong Chen et al., "Self–assembled growth of epitaxial erbium disilicide nanowires on silicon (001)", Applied Physics Letters, vol. 76, No. 26, pp. 4004–4006 (Jun. 26, 2000).

* cited by examiner

*Primary Examiner*—Deborah Jones
*Assistant Examiner*—Stephen Stein

(57) ABSTRACT

Self-assembled nanowires are provided, comprising nanowires of a first crystalline composition formed on a substrate of a second crystalline composition. The two crystalline materials are characterized by an asymmetric lattice mismatch, in which in the interfacial plane between the two materials, the first material has a close lattice match (in any direction) with the second material and has a large lattice mismatch in all other major crystallographic directions with the second material. This allows the unrestricted growth of the epitaxial crystal in the first direction, but limits the width in the other.

18 Claims, 4 Drawing Sheets

METHOD TO GROW SELF-ASSEMBLED EPITAXIAL NANOWIRES

CROSS-REFERENCE TO RELATED APPLICATION

The present application is a non-provisional application and claims priority from provisional application Serial No. 60/300,440, filed on Jun. 26, 2001.

TECHNICAL FIELD

The present invention is related generally to electronic devices whose functional scales are measured in nanometers, and, more particularly, to forming one-dimensional epitaxial crystals with widths and heights at the nanometer scale.

BACKGROUND ART

The synthesis of artificial low-dimensional structures to confine electrons has been a topic of scientific and technical interest for decades. Epitaxial deposition techniques have made possible the growth of two-dimensional quantum wells as thin as one atomic layer and "zero"-dimensional islands as small as a few nanometers. However, the formation of robust "one"-dimensional nanowires with a width less than 10 nm has been a major goal that has proven difficult to achieve by either epitaxial growth or lithographic processing. Various "self-assembly" techniques, in which structures form spontaneously under kinetic or thermodynamic control, have been used to grow wire-like structures directly on a semiconductor surface. Previous demonstrations include decoration of step edges on substrates, the preferential capture of adatoms onto an oriented string of dangling bonds at a surface, the growth of a lattice-matched epilayer with anisotropic surface energy, and the growth of a lattice-mismatched epitaxial layer on a low symmetry substrate with a large anisotropic stiffness. Each of these techniques depends on some type of symmetry-breaking phenomenon at the substrate surface to encourage linear growth along a preferred direction. However, they often produce wire-like structures that meander along with the steps, are terminated by single steps, have irregular shapes and sizes, and/or are not robust.

In general, an atomically flat two-dimensional epitaxial overlayer can be grown when the lattice constant of the epilayer matches that of the substrate on which it is grown. As the lattice-mismatch increases ($\geq 2\%$), the strain energy in the deposited film can be relaxed by the creation of islands of the epitaxial material. In the cases of the most often studied systems, e.g., Ge on Si(001) and InAs on GaAs (001), both the substrate surfaces and the overlayers have fourfold crystallographic symmetry with respect to the surface normal. These lattice-mismatched systems will thus limit the lateral growth in all directions on the substrate surface and produce strained islands. This suggests a strategy for the intentional epitaxial growth of linear structures: choose an overlayer material that is closely lattice matched to the substrate along one major crystallographic axis but has a significant lattice mismatch along the perpendicular axis. In principle, this should allow the unrestricted growth of the epitaxial crystal in the first direction but limit the width in the other.

A related phenomenon has been observed in the annealing behavior of Pt thin films deposited on Si(001); see, K. L. Kavanagh et al, "High-temperature epitaxy of PtSi/Si(001), *Journal of Crystal Growth*, Vol. 173, pp. 393–401 (1997). Highly elongated PtSi islands formed that were at a minimum 30 nm wide and as long as 3 $\mu$m. In this case, PtSi has an orthorhombic crystal structure for which the lattice mismatch with respect to Si(001) was −6.0% along the $[110]_{Si}$ direction (the long axis of the island) and at least +6.3% along the perpendicular direction (the short axis). However, because of the large lattice mismatches along both directions, the sizes and shapes of the PtSi islands were quite heterogeneous.

Thus, there is a need for methods to grow one-dimensional epitaxial crystals with widths and heights at the nanometer scale, and lengths at the micrometer scale, which are aligned along selected crystallographic directions with high crystal quality.

DISCLOSURE OF INVENTION

In accordance with the present invention, self-assembled nanowires are provided, comprising nanowires of a first crystalline composition formed on a substrate of a second crystalline composition. The two crystalline materials are characterized by an asymmetric lattice mismatch, in which the first material has a close lattice match (in one major crystallographic direction within the interfacial plane formed between the two materials) with the second material and has a large lattice mismatch in all other major crystallographic directions within the interfacial plane with the second material.

The nanowires are grown by first selecting the appropriate combination of materials that fulfill the foregoing criteria. The surface of the substrate on which the nanowires are to be formed must be cleaned in order to ensure that the surface has atomically flat terraces, a regular atomic structure on terraces, and regular steps and to remove impurities. Finally, epitaxial deposition of the first crystalline material on the cleaned surface is performed, with an appropriate deposition temperature, deposition rate, deposition amount, and annealing temperature and time, thereby forming the self-assembled nanowires.

The present invention provides a means to grow one-dimensional epitaxial crystals with widths and heights at the nanometer scale, and lengths at the micrometer scale, which are aligned along certain crystallographic directions with high crystal quality. Further, the present invention avoids traditional lithography-deposition-etching methods, minimizes defects formed during the normal lithography process and environmental toxic chemicals usage, simplifies the manufacturing processes, and allows self-assembled formation of high-quality one-dimensional nano-wires over large areas.

BEST MODES FOR CARRYING OUT THE INVENTION

In general, an atomically flat two-dimensional epitaxial overlayer can be grown when the lattice constant of the epilayer matches that of the substrate on which it is grown. As the lattice-mismatch increases (>2%), the strain energy in the deposited film can be relaxed by the creation of islands of the epitaxial material; see, e.g., P. M. Petroff et al, "MBE and MOCVD Growth and Properties of Self-Assembling Quantum Dot Arrays in III–V Semiconductor Structures", *Superlattices and Microstructures,* Vol. 15, pp. 15–21 (1994). In the cases of the most studied systems, e.g., Ge on Si(001), and InAs on GaAs(001), both the substrate surfaces and the overlayers have four-fold crystallographic symmetry with respect to the surface normal. These lattice-mismatched systems will thus limit the lateral growth in all directions on the substrate surface and produce strained islands; see, Petroff et al, supra.

The intentional epitaxial growth of linear structures is provided herein that involves choosing an overlayer material that is closely-lattice matched to the substrate along one major crystallographic axis but has a significant lattice mismatch along all other major crystallographic axes within the interface between the epitaxial crystal and the substrate. In principle, this allows the unrestricted growth of the epitaxial crystal in the first direction but limits the width in the other. In general, any crystalline material that can be characterized by an asymmetric lattice mismatch, in which the first material has a close lattice match (in any one major crystallographic direction) with the second material and has a large lattice mismatch along all other major crystallographic axes within the interface between the epitaxial crystal and the substrate. By a close lattice match is meant that the absolute value of lattice mismatch between the two crystal materials is less than 4%. By a large lattice mismatch is meant that the absolute value of lattice mismatch between the two crystal materials is within the range of about 4 to 10%. While in principle any crystallographic direction may be chosen, preferably, the asymmetric lattice mismatch occurs along all major crystallographic directions within the interface between the epitaxial crystal and the substrate. By "major crystallographic direction" is meant any direction within the interfacial plane along which the crystal may prefer to grow.

Figure 1:
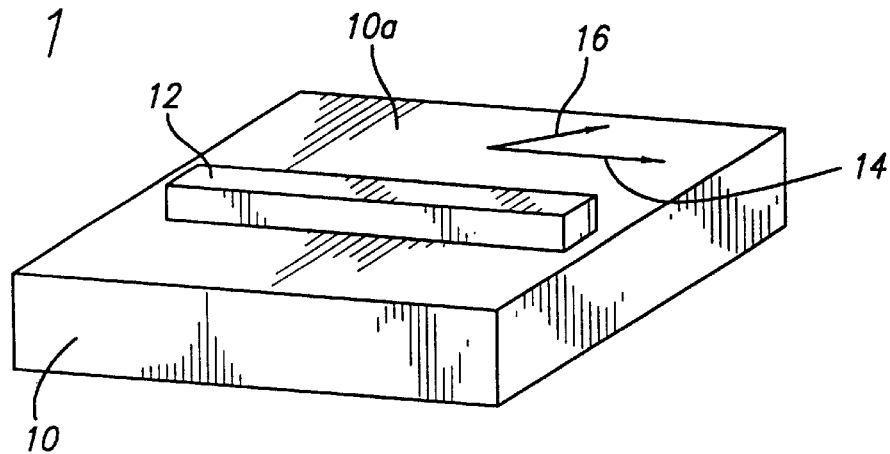
FIG. 1 is a perspective view of a single crystal substrate and an epitaxial nanowire thereon, depicting the lattice-mismatch axes.

FIG. 1 depicts a single crystal substrate 10 on the top surface 10a of which is grown a single crystal nanowire 12. The axis with small lattice-mismatch is denoted 14, while the axis with larger lattice-mismatch is denoted 16.

In principle, any single crystal material that evidences sufficient electrical conductivity to be useful as nanowires may be used in combination with any single crystal material that serves as a substrate on which the nanowires can be grown, provided that the asymmetric lattice mismatch conditions described above are met. One preferred combination, described next, include metal silicides grown on silicon substrates. However, the same teachings herein may be employed, using intermetallic alloys grown on single crystal substrates such as germanium, sapphire, III–V compound semiconductors, whether binary (e.g., GaAs, InP, etc.), ternary (e.g., InGaAs), or higher (e.g., InGaAsP), II–VI compound semiconductors, and IV–VI compound semiconductors. Examples of such combinations are listed in U.S. Pat. No. 5,045,408, entitled "Thermodynamically Stabilized Conductor/Compound Semiconductor Interfaces", issued on Sep. 3, 1991, to R. Stanley Williams et al, the contents of which are incorporated herein by reference.

The epitaxial material comprising the nanowires is preferably represented as $MSi_2$, where M is a metal selected from the group consisting of Sc, Y, and rare earths, where the substrate material preferably comprises a silicon(001) substrate. Preferred rare earths include Er, Dy, Gd, Th, Ho, Tb, and Sm.

The method of the invention for forming the nanowires of the first material on a surface of the second material comprises:

(a) selecting the appropriate epitaxial material and its growth substrate with an appropriate asymmetric lattice-mismatch;

(b) cleaning a surface of the substrate so that the surface has an atomically flat, regular atomic structure on terraces and has regular steps and so that impurities are removed; and (c) epitaxially depositing the (single crystalline) epitaxial material on the surface of the single crystal substrate. Such epitaxial deposition employs an appropriate deposition rate, deposited material amount, deposition temperature, and post-growth annealing temperature and time. It is well known that different material systems and different deposition systems will require values that are unique to that particular system. However, the deposition of metal disilicides on silicon is known, and, based on the teachings herein and in the prior art, conventional experimentation is sufficient to determine the specific values for a given material system and deposition system.

The cleaning step may be performed by heating the substrate to an elevated temperature, such as about 900° to 1200°, in a high vacuum, such as less than $1 \times 10^{-9}$ Torr for a few minutes, and then cooling. Alternatively, a combination of chemical and ultraviolet treatments may be used, such as HF to remove surface $SiO_2$, UV to decompose carbon impurities on the surface, and a strong acid, such as $H_2SO_4$ or HCl, to remove organic impurities.

Steps occur naturally in polished crystal surfaces, and while it is preferred that they be absent, nonetheless, the teachings of the present invention may be used in the presence of such steps, so long as flat terraces, a regular atomic structure on the terraces, and regular steps can be obtained. This is the purpose of the substrate surface cleaning.

In the case that two or more crystallographic axes on the substrate surface have a small lattice-mismatch between the epitaxial layer and the substrate crystal, this will lead to two or more sets of nanowires grown along these crystallographic axes. In order to grow only one set of parallel nanowires, one can use substrates misoriented with small angles away from the major crystallographic axis to create steps aligned in parallel in one direction. By a "small" angle is meant an angle in the range from 0.1 to 10 degrees. By using such misoriented substrates, the growth of the nanowires parallel to the steps will be promoted and the growth of nanowires not parallel to the steps will be suppressed.

The dimensions of the nanowires can be controlled by the lattice-mismatch, substrate surface morphology, and growth conditions. The widths and heights of the nanowires in general will decrease as the large lattice mis-match along the width direction increases, since it is energetically unfavorable to attach adatoms along the width directions with larger lattice-mismatch. The length will increase with the decrease of the lattice-match along the length direction, since it is energetically favorable to attach adatoms to the less lattice-mismatch sites. One can grow nanowires with desired dimensions by selecting epitaxial materials with designed lattice-mismatches. One can also grow epitaxial alloys of different materials to fine-tune the lattice-mismatches to the desired values. For example, a mixed disilicide of, for example, erbium and dysprosium, could be formulated to obtain a nanowire composition having a desired lattice-mismatch value, such as by extrapolating values as given, for example, in FIGS. 6a–6b, discussed below.

The substrate surface and step morphology may also influence the nanowire morphology significantly. The growth of a nanowire may be terminated by reaching a step bunch or by intersecting a perpendicular nanowire. In order to increase the nanowire length, one can use a substrate with wide terraces (therefore less steps), or use a substrate misoriented from major crystallographic axes with a small angle (0.1 to 10 degrees) to create steps in a parallel direction and promote the growth of the parallel nanowires. That is to say, uniaxial nanowires may be grown on a substrate surface with uniaxial regular atomic steps wherein either the substrate surface is so misoriented or its normal direction is so misoriented.

Figure 2A:
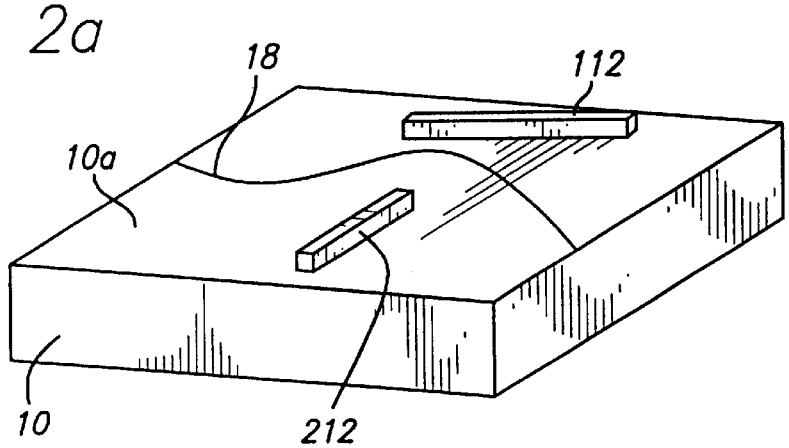
FIGS. 2a–2b are each a perspective view of nanowires formed on a substrate surface with an irregular surface step (FIG. 2a) and with regular surface steps (FIG. 2b)
Figure 2B:
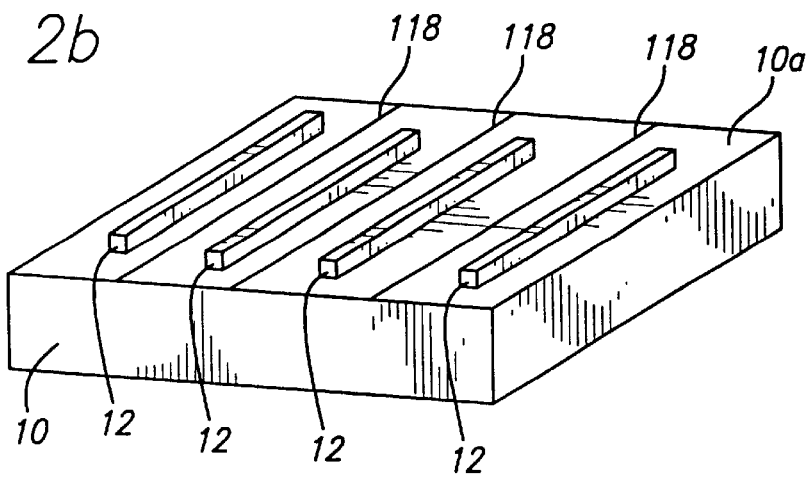

FIG. 2a illustrates an undesirable situation, in which an irregular surface step 18 exists on the surface 10a of the silicon substrate 10. Here, nanowires 112 and 212 are formed aligned in different directions. On the other hand, FIG. 2b illustrates a desirable situation, in which regular surface steps 118 occur in a parallel, aligned manner. Consequently, self-assembled nanowires 12 are also formed in a parallel, aligned manner.

EXAMPLES

The foregoing preparation of nanowires on substrates employing asymmetric lattice mismatch has been illustrated experimentally with four examples: $ScSi_2$, $ErSi_2$, $DySi_2$, and $GdSi_2$ grown on Si(001), which have lattice mismatches of −4.6%, 6.3%, 7.6%, and 8.9%, respectively, along one of the Si<110> directions and mismatches of 0.8%, −1.6%, −0.1%, and 0.8%, respectively, along the perpendicular Si<110> direction. The resulting self-assembled nanowires have widths and heights in the range of 3 to 11 nm and 0.2 to 3 nm, respectively, depending on the lattice mismatches. The average lengths of the nanowires are in the range 150 to 450 nm, and are determined primarily by kinetic issues. Under suitable kinetic growth conditions, the morphology of the nanowires is predominantly controlled by the lattice-mismatches. A comparison of the $ScSi_2$, $ErSi_2$, $DySi_2$, and $GdSi_2$ systems (arranged in order of increasing lattice mismatch) reveals a decrease in the average nanowire widths and heights and a corresponding increase in average nanowire lengths correlating to the amount of lattice mismatch.

The most work has been done with $ErSi_2$, which is described in Example 1 below. The work with regard to $ScSi_2$, $DySi_2$, $HoSi_2$, and $GdSi_2$ is the subject of Examples 2–5.

Due to the asymmetric lattice mismatch, it is possible to fabricate nanowires having a width and height that are both less than 100 nm (width=1 to 100 nm and height=0.2 to 100 nm) and a length that is within a range of about 10 nm to 10 μm.

Example 1

$ErSi_2$

The following example demonstrates that by utilizing an epitaxial overlayer that has a carefully chosen lattice mismatch to complement the host substrate, in this case erbium disilicide ($ErSi_2$) on Si(001), it is possible to grow nanowires. Due to its high conductivity ($2.9 \times 10^4 (\Omega cm)^{-1}$) and low Schottky barrier to n-type Si, $ErSi_2$ thin films grown on Si substrates have been studied extensively. These studies involved continuous thin films on Si(001) that were several nanometers thick, and they revealed oriented crystallites with a hexagonal $AlB_2$-type crystal structure that were thermodynamically stable in contact with Si below 800° C. The [0001] axis of the $ErSi_2$ was oriented along a <110> axis of the Si(001) substrate, and the $[11\bar{2}0]$ of the $ErSi_2$ was oriented along the perpendicular <110> axis, with lattice mismatches of +6.5% and −1.3%, respectively, which nearly satisfies the proposed growth conditions for nanowires. Next, submonolayer amounts of Er were deposited on Si(001) and the structure of the resulting crystallites was examined, exploring various growth conditions to optimize one-dimensional growth.

In the present experiments, device quality "flat" Si(001) substrates were prepared by heating to 1200° C. for 20 sec in an ultrahigh vacuum (UHV) chamber with a pressure<1× $10^{-9}$ Torr. Prior to deposition, the surface structures of the substrates were investigated in situ with an Omicron scanning tunneling microscope (STM) with a pressure<2×$10^{-10}$ Torr to ensure they were clean and to examine the nature of the steps on the starting surface. Erbium was then deposited on the substrates with an in situ electron-beam evaporator with the thickness monitored by an internal flux meter that was calibrated by ex situ by Rutherford back-scattering spectrometry. The substrate temperatures during depositions ranged from room temperature (~23° C.) to 620° C. The deposition times ranged from a few seconds to 7 min, yielding coverages of erbium up to ~0.5 monolayer (ML). After a deposition, the samples were annealed at temperatures ranging from 575° to 800° C. for 5 minutes to enhance the chemical reaction between the erbium and silicon. The surfaces of the samples were then investigated again with the STM. Additionally, one sample was further analyzed in cross-section with a JEOL-4000 transmission electron microscope (TEM).

Figure 3:
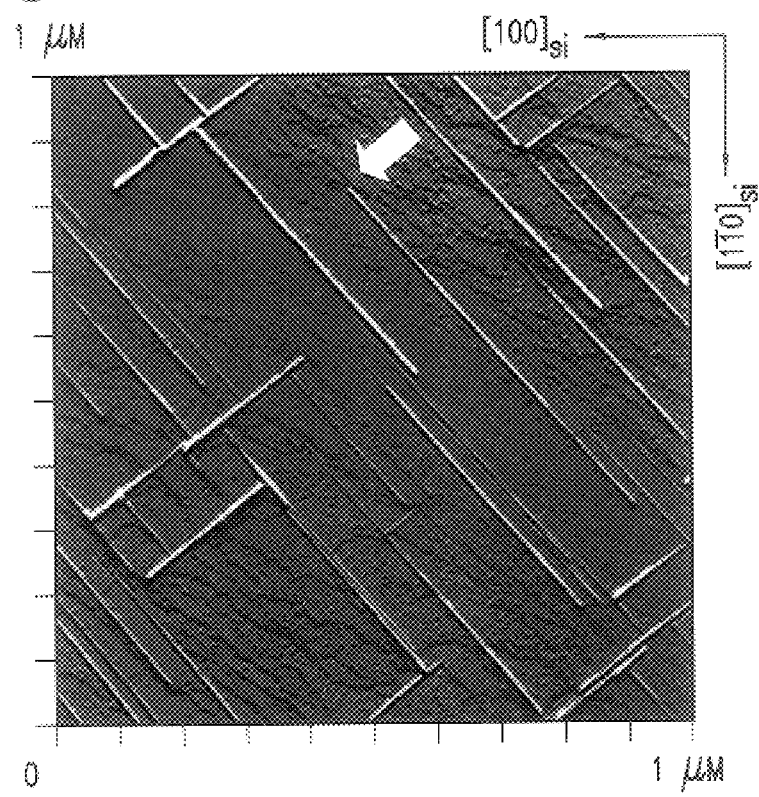
FIG. 3 is a low-resolution STM topograph showing ErSi$_2$ nanowires grown on a flat Si(001) substrate.

A STM image of $ErSi_2$ nanowires grown on the flat Si(001) substrate is shown in FIG. 3. The substrate slopes upward from bottom right to top left, with terraces of different heights indicated by different stippling. Steps and step bunches, which appear as black irregular lines, are distorted by the nanowires along $[110]_{Si}$ and $[1\bar{1}0]_{Si}$ directions. Before the Er nanowire deposition, the single-atomic-height steps were oriented primarily along the $[\bar{2}10]_{Si}$ axis with average terrace widths of 19.8 nm. The Er was deposited at 620° C. for 1 min, yielding a coverage of ~0.09 ML, and then annealed at 620° C. for 2 more minutes after the deposition. On each Si(001) terrace, the $ErSi_2$ nanowires align along one of the two perpendicular <110>$_{Si}$ directions, not along the original $[\bar{2}10]_{Si}$ step direction. The average dimensions of the two sets of the perpendicular nanowires were measured from STM images with higher magnification, and are listed in Table I. The average length of the nanowires was approximately eight times the original step separation along $[110]_{Si}$ and $[1\bar{1}0]_{Si}$, respectively, The wires were straight and did not follow or terminate at single Si atomic steps, but rather the steps formed a zig-zag pattern that locally followed the nanowires. The cross-sectional TEM images did not reveal any detectable protrusion of the nanowires below the Si(001) surface.

TABLE I

Average dimensions and their interwire standard deviations (listed in parentheses) of the nanowires (NWs) shown in FIG. 3 (units in nm).

|  | Width | Height | Length |
|---|---|---|---|
| NWs along $[110]_{Si}$ | 5.57 (2.33) | 0.96 (0.35) | 185 (32) |
| NWs along $[1\overline{1}0]_{Si}$ | 3.04 (1.59) | 0.74 (0.32) | 472 (77) |

Figure 4:
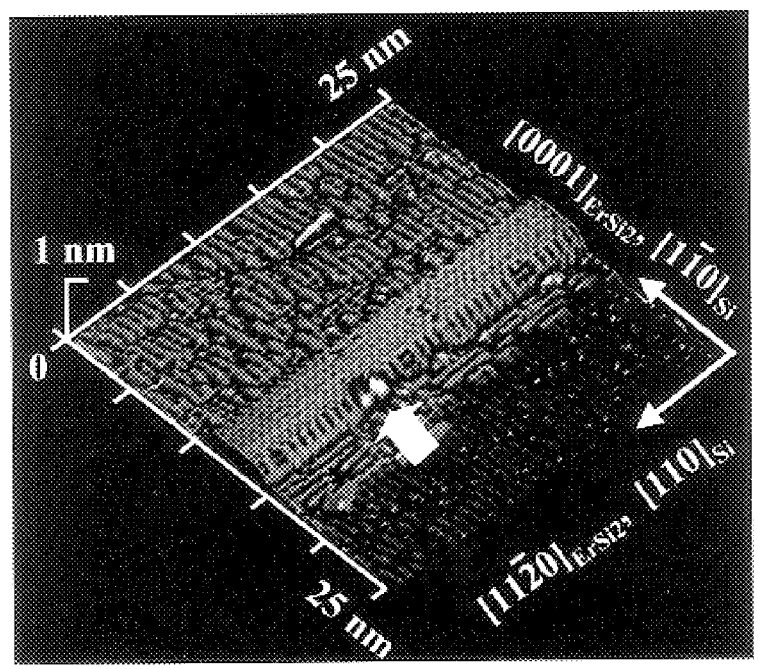
FIG. 4 is a high resolution (25 nm×25 nm) STM topograph showing a section of an ErSi$_2$ nanowire and Si(100) dimer rows.

FIG. 4 shows a typical atomic-resolution STM image of a section of a nanowire from the sample shown in FIG. 3. The Si terraces increase in height from lower right to upper left.

This nanowire had a measured width of 4.69 nm and a height of 0.70 nm. The top surface and the edges of the nanowire are atomically regular over most of its length, although FIG. 4 does show an atomic kink associated with a defect (marked by the arrow) at the edge of the nanowire. The periodic structure on top of the nanowire agrees well with a "c(2×2)" reconstruction of a slightly distorted $ErSi_2(1\overline{1}00)$ surface, and the $ErSi_2$ lattice appears to be elastically strained to fit the Si substrate. As measured from FIG. 4, the lattice spacings on the nanowire surface along $[11\overline{2}0]ErSi_2$ and $[0001]ErSi_2$ directions are 0.35±0.04 nm and 0.38±0.04 nm, respectively, which agree with the value of the atomic spacing along $<110>_{Si}$ directions on the Si(001) surface, 0.384 nm, within the measurement uncertainties. No dislocations have been observed in the STM images of these as-grown wires.

Figure 5A:
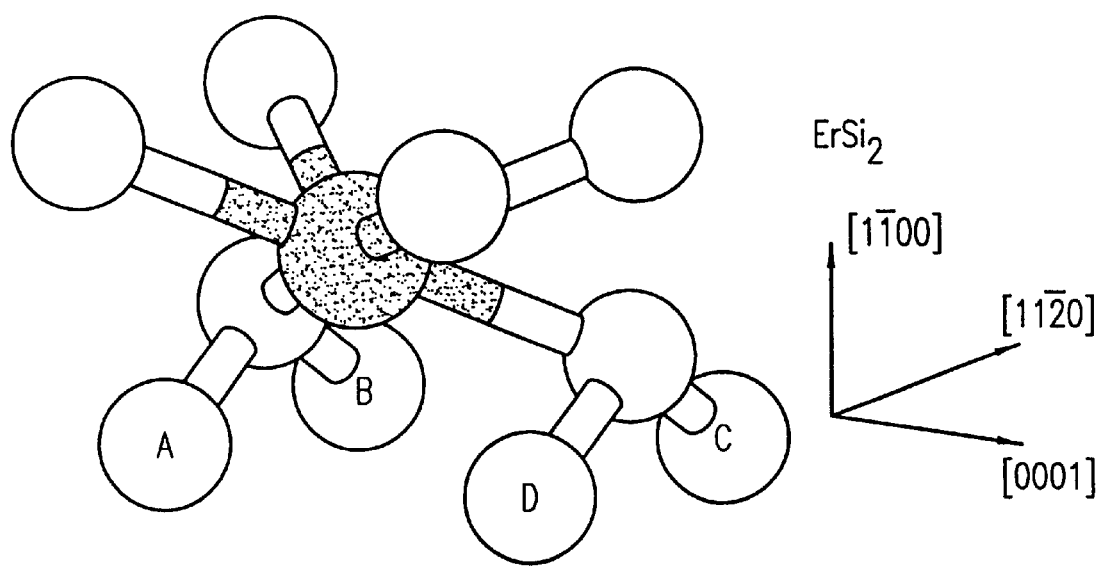
FIGS. 5a–5b are schematic diagrams illustrating the bulk atomic structures of an ErSi$_2$ crystal (FIG. 5a) and a Si crystal (FIG. 5b), and the orientation relationship between the wires and the substrate.
Figure 5B:
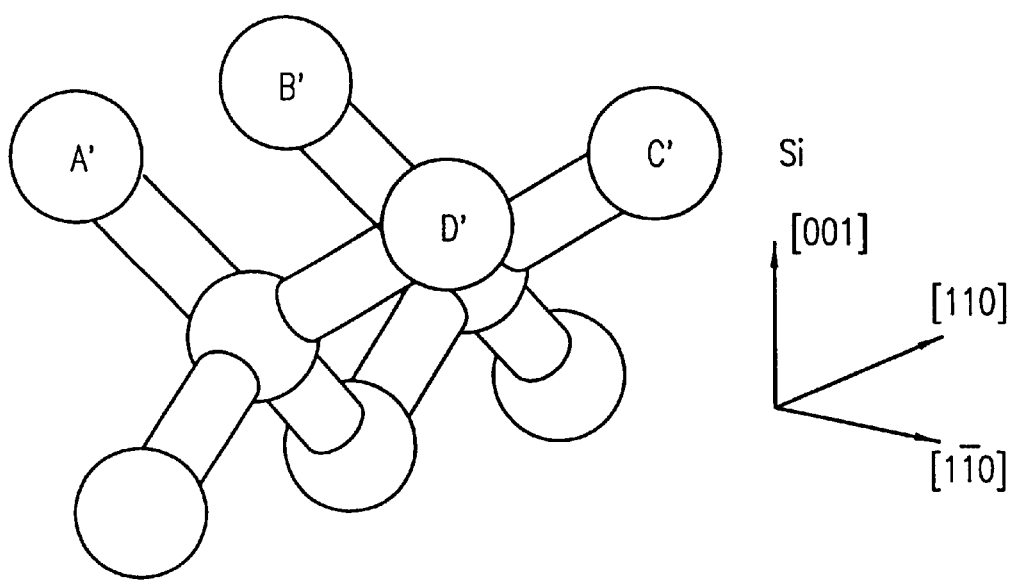

FIGS. 5a–5b illustrate the bulk atomic structures of $ErSi_2$ and Si crystals, respectively, and the orientation relationship between the wires and the substrate. Spheres 50 and 52 represent the Si and Er atoms, respectively. The Si atoms proposed to form the interface between $ErSi_2$ and Si are marked with A, B, C, D, and A', B', C', D', respectively, and the unified $ErSi_2$/Si structure is formed by superimposing A on A', etc. That is to say, when the $ErSi_2$ is bonded to Si(001), the Si atoms in $ErSi_2$ marked as A, B, C, and D could replace those on Si(001) marked as A', B', C', and D', respectively. Such a bonding geometry maintains the bulk-like Si—Si bonds on both the $ErSi_2$ and Si sides of the interface. However, the bulk atomic distances between Si atoms in $ErSi_2$ along the $[11\overline{2}0]ErSi_2$ direction (A-B and C-D) and the $[0001]ErSi_2$ direction (A-D and B-C) are 0.379 nm and 0.409 nm, respectively, which differ from the bulk atomic distance, 0.384 nm, between Si atoms (A'-B'-C'-D'-A'). When $ErSi_2$ grows on the Si(001) surface, the lattice-mismatch strain along the $[0001]ErSi_2$ axis increases much faster than that along $[11\overline{2}0]ErSi_2$. To minimize the strain energy, the $ErSi_x$ crystal grows preferentially along the $[11\overline{2}0]ErSi_2$ direction.

Given the model shown in FIGS. 5a–5b, the "2×1" dimer rows on the Si(001) surface are oriented along the $[1\overline{1}0]_{Si}$ direction by pairing of the dangling bonds on A'-B' and C'-D'. These dimer rows should thus be perpendicular to the nanowires growing on the same terrace, as observed and shown in FIG. 4.

Without subscribing to any particular theory, since sub-surface Si does not react appreciably with the Er to form the nanowires, the source of the Si atoms in the $ErSi_2$ is most likely the step edges. The arrangement of the wires and steps after growth on the flat surface provides an important clue to the mechanism of nanowire formation. As the leading end of a growing nanowire approaches a Si step, the terrace dissolves and effectively retreats from the advancing wire. This creates a "snow-plow" effect, causing successive step edges to bunch up, e.g., as marked by the arrow in FIG. 3. The growth of a nanowire is thus either terminated by intersecting a perpendicular nanowire or by reaching a step bunch that is too high to dissociate, as shown in a large number of STM images such as FIG. 3. In general, the lengths of the nanowires on different samples were approximately proportional to but significantly longer than the average predeposition terrace widths, and they increased with decreasing nanowire density. The sizes of the nanowires can thus be modulated by the morphology of substrate surface and the amount of deposited Er.

A review of all the metal-silicon phase diagrams and known crystal structures of silicides indicates that $ErSi_2$ is only one example from a significant collection of thermodynamically stable binary compounds that can form nanowires on Si(001). Nearly all of the rare-earth elements have silicides that should form one-dimensional crystals, some with even better lattice matches than $ErSi_2$. These other silicides display a wide range of bulk electronic, optical, and magnetic properties that should provide a fascinating field of study for transport in nanowires. Self-assembled arrays of nanowires may also be used as conductors for defect-tolerant nanocircuits or as a template for further nanofabrication.

Examples 2–5

$ErSi_2$, $ScSi_2$, $DySi_2$, $GdSi_2$ and Their Comparison

In the following experiments, device quality "flat" Si(001) substrates were prepared as in Example 1.

As measured from STM images, the average terrace widths along $[110]_{Si}$ and $[1\overline{1}0]_{Si}$ were 57.8 nm and 21.3 nm, respectively, implying that the normal direction of the surface of the Si substrate used in these experiments was misoriented from $[001]_{Si}$ toward $[120]_{Si}$ by about 0.4°.

The final state of the nanowires was influenced by their growth conditions, such as deposition and annealing temperature, deposition rate, coverage of deposited atoms, and annealing time. The physical properties of Sc, Er, Dy, and Gd are similar (e.g., their melting points are 1539° C., 1522° C., 1409° C., and 1314° C. respectively), and the experimentally-determined growth conditions for producing dislocation-free nanowires are also very close. The optimum substrate temperature and time for defect-free nanowire growth were about 575 to 620° C. and about 2 to 5 minutes, respectively. When the annealing temperature and/or time exceeded these ranges, dislocations were introduced into the silicide crystals to relieve the lattice-mismatch strain, leading to the coarsening and fragmentation of the nanowires. When the annealing temperature and/or time fell below the optimum ranges, the reaction between the deposited metal and Si substrate was incomplete, and the nanowires remained in their early stages of growth. The amount of deposited metal was usually about 0.05 to 0.5 monolayer (ML). When the coverage fell below this range, only randomly distributed atomic clusters were formed; when the coverage exceeded this range, coarsening and intersection of the nanowires resulted in the formation of silicide meshes or even continuous thin films.

Figure 6A:
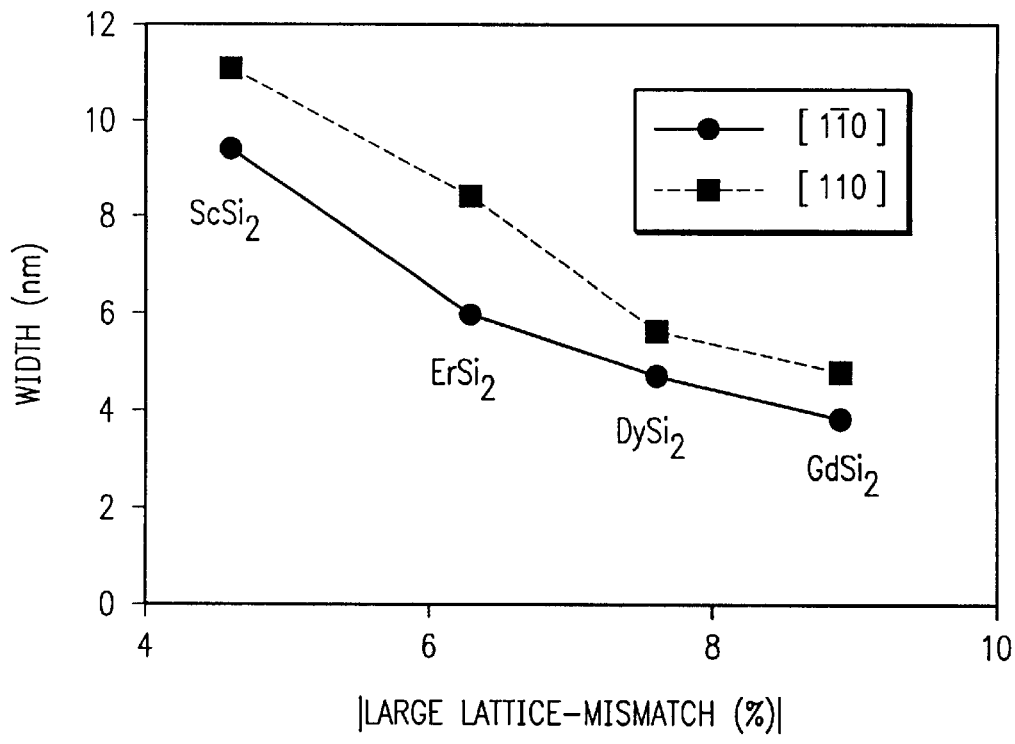
FIGS. 6a–6b, on coordinates of dimension (in nanometers) and absolute value of lattice-mismatch (in percent), are plots of the width (FIG. 6a) and height (FIG. 6b) as a function of lattice-mismatch for four metal disilicides.
Figure 6B:
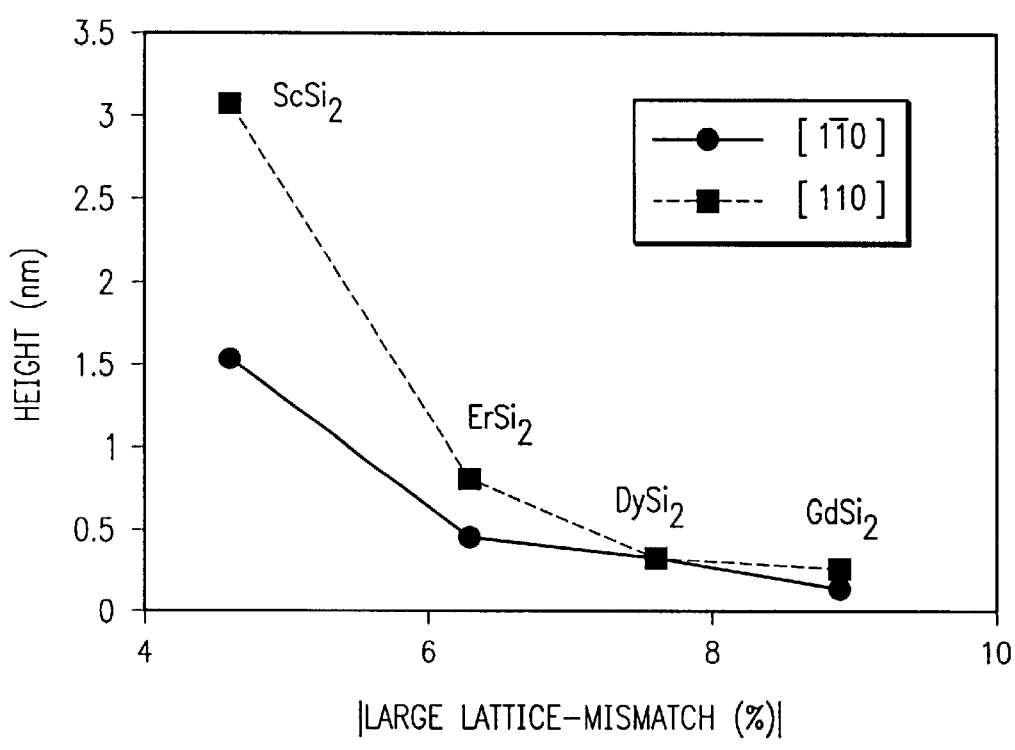

For these $ScSi_2$, $ErSi_2$, $DySi_2$, and $GdSi_2$ samples shown in FIGS. 6a–6b, the metals were deposited on Si substrates at 600° C. for 2 minutes, yielding coverages of about 0.35 ML Sc, about 0.20 ML Er, about 0.25 ML Dy, and about 0.28 ML Gd. After the deposition, the samples were then annealed at 600° C. for 2 more minutes. Nanowires aligned along one of the two perpendicular $<110>_{Si}$ directions were observed on all four samples. The wires were straight and did not follow or terminate at single Si atomic steps, but rather the steps formed a zig-zag pattern with significant step bunching that locally followed the nanowires.

The widths and heights of the different silicide nanowires varied significantly because of their different lattice-mismatches with respect to the Si substrate. The average dimensions of the $ScSi_2$, $ErSi_2$, $DySi_2$, and $GdSi_2$ nanowires were measured from STM images with higher magnification, and are shown as a function of the appropriate lattice-mismatch in FIGS. 6a–6b. As shown in FIGS. 6a–6b, the average widths and heights of the nanowires decreased monotonically as the absolute values of the lattice-mismatches along the width direction increases. However, there was no simple relation between the average lengths of the nanowires and the lattice-mismatches along the length direction.

The lattice spacings on all the nanowire surfaces along their length directions agreed with the value of the atomic spacing along $<110>_{Si}$ directions on the Si(001) surface, 0.384 nm, within the measurement uncertainties. The observed periodic structures on the top surfaces of the nanowires agreed well with a "2×n" reconstruction of a slightly distorted silicide surface, where n varies for the different silicides, and thus the silicide lattices appear to be elastically strained to fit the Si substrate in the width direction. No dislocations were observed in the STM images of the nanowires grown under the growth conditions specified above. The top and the edges of the nanowires were usually atomically smooth except for occasional point defects (mainly vacancies). The lattice-mismatch also influenced the shape of the nanowires. The $ScSi_2$ nanowires usually had a trapezoidal cross-section with sidewall slopes in the range 15° to 21°. For the silicides in compression, the nanowires were more rectangular with a ($1\bar{1}00$) plane defining the top surface, but their shape did change with increasing lattice mismatch. The $ScSi_2$, $ErSi_2$, and $DySi_2$ nanowires always grew on the top of a Si terrace, but some sections of $GdSi_2$ nanowires grew into a Si terrace and appeared to be slightly below the level of the surrounding Si as detected by STM. When the end of a growing nanowire approached a Si step, it did not change direction to follow the original Si step edge, but rather the step conformed to the nanowire and/or retreated from the advancing nanowires.

Industrial Applicability

The self-assembled growth of epitaxial nanowires is expected to find use in devices and structures that employ nanowires.

What is claimed is:

1. Self-assembled epitaxial nanowires comprising an epitaxial crystal comprising a first material grown on a crystal substrate comprising a second material, whereby an interfacial plane is formed between the epitaxial crystal and the crystal substrate, wherein said first material is closely-lattice matched to said second material along one major crystallographic axis on said interfacial plane, but has significant lattice mismatch along all other major crystallographic axes on said interfacial plane.

2. The nanowires of claim 1 wherein said nanowires have a width within a range of about 1 to 100 nm, a height within a range of about 0.2 to 100 nm, and a length within a range of about 10 nm to 10 μm.

3. The nanowires of claim 1 wherein said first material comprises a metal disilicide represented by the formula $MSi_2$, where M is selected from the group consisting of scandium, yttrium, and rare earths, and wherein said second material comprises silicon(001).

4. The nanowires of claim 3 wherein said rare earths are selected from the group consisting of erbium, dysprosium, gadolinium, thulium, holmium, terbium, and samarium.

5. A method for forming self-assembled epitaxial nanowires comprising an epitaxial crystal comprising a first material grown on a crystal substrate comprising a second material, whereby an interfacial plane is formed between the epitaxial crystal and the crystal substrate, wherein said first material is closely-lattice matched to said second material along one major crystallographic axis on said interfacial plane, but has significant lattice mismatch along all other major crystallographic axes on said interfacial plane, said method comprising:

(a) selecting as said first material a composition that is closely-lattice matched to said second material along one major crystallographic axis, but has significant lattice mismatch along all other crystallographic axes in said interfacial plane;

(b) cleaning a surface of said substrate so that said surface has an atomically flat, regular atomic structure on terraces and has regular steps and so that impurities are removed; and (c) epitaxially depositing said first material on said surface of said second material.

6. The method of claim 5 wherein said nanowires have a width within a range of about 1 to 100 nm, a height within a range of about 0.2 to 100 nm, and a length within a range of about 10 nm to 10 μm.

7. The method of claim 6 wherein the dimensions of said nanowires are adjusted by selecting lattice-mismatch values between said epitaxial nanowires and said crystal substrate.

8. The method of claim 7 wherein said lattice-mismatch values are obtained by selecting alloy compositions of said nanowire material.

9. The method of claim 5 wherein uniaxial nanowires are grown on said substrate with uniaxial regular atomic steps misoriented with a small angle of about 0.1 to 10 degrees from a major crystallographic axis.

10. The method of claim 9 wherein said uniaxial regular atomic steps on said substrate surface are obtained by providing said substrate surface with its normal direction misoriented with a small angle of about 0.1 to 10 degrees from a major crystallographic axis.

11. The method of claim 5 wherein said first material comprises a metal disilicide represented by the formula $MSi_2$, where M is selected from the group consisting of scandium, yttrium, and rare earths, and wherein said second material comprises silicon.

12. The method of claim 11 wherein said rare earths are selected from the group consisting of erbium, dysprosium, gadolinium, thulium, holmium, terbium, and samarium.

13. The method of claim 5 wherein said surface is cleaned by heating to an elevated temperature in a high vacuum for a few minutes and then cooling.

14. The method of claim 13 wherein said elevated temperature is within a range of about 900° to 1200° C. and said high vacuum is less than $1 \times 10^{-9}$ Torr.

15. The method of claim 5 wherein said surface is cleaned by using a combination of chemical treatment comprising exposure thereof to strong acids and ultraviolet exposure.

16. The method of claim 5 wherein said epitaxial deposition is performed with an in situ electron-beam evaporator, employing substrate temperatures ranging from room temperature to 620° C.

17. The method of claim 5 wherein after said epitaxial deposition, said nanowires formed on said substrate are annealed to enhance chemical reaction between said nanowires and said substrate.

18. The method of claim 17 wherein said annealing is performed at a temperature within a range of 575° to 800° C. for a time of up to 5 minutes.

* * * * *